United States Patent
Kim et al.

(10) Patent No.: US 7,622,864 B2
(45) Date of Patent: Nov. 24, 2009

(54) METHOD OF MANUFACTURING AN ORGANIC LIGHT EMITTING DIODE

(75) Inventors: Tae-Whan Kim, Seoul (KR); Dong-Chul Choo, Seoul (KR)

(73) Assignees: Samsung Electronics Co., Ltd. (KR); Industry-University Cooperation Foundation, Hanyang University (KR)

( * ) Notice: Subject to any disclaimer, the term of this patent is extended or adjusted under 35 U.S.C. 154(b) by 355 days.

(21) Appl. No.: 11/540,389

(22) Filed: Sep. 29, 2006

(65) Prior Publication Data
US 2007/0075637 A1 Apr. 5, 2007

(30) Foreign Application Priority Data
Sep. 30, 2005 (KR) .................... 10-2005-0091762

(51) Int. Cl.
*H01J 9/00* (2006.01)
*H01J 1/62* (2006.01)
(52) U.S. Cl. .................... 313/506; 313/504; 445/23
(58) Field of Classification Search ......... 313/504–506; 445/23–25
See application file for complete search history.

(56) References Cited

U.S. PATENT DOCUMENTS

| | | | |
|---|---|---|---|
| 6,121,727 A * | 9/2000 | Kanai et al. | 313/504 |
| 7,382,421 B2 * | 6/2008 | Hoffman et al. | 349/43 |
| 2006/0263593 A1 * | 11/2006 | Aziz et al. | 428/328 |

FOREIGN PATENT DOCUMENTS

KR   1020040065667   7/2004

OTHER PUBLICATIONS

"Study on electroluminescent behavior of Ga/Alq3/TCAQ/ITO double layer device"; 1997 Elsevier Science S.A.; pp. 1267-1268; Synthetic Metals 85 (1997).

* cited by examiner

*Primary Examiner*—Joseph L Williams
(74) *Attorney, Agent, or Firm*—Cantor Colburn LLP

(57) ABSTRACT

A manufacturing method of an organic light emitting diode ("OLED") includes forming an anode on a substrate, forming an inorganic buffer layer on the anode, forming a hole transport layer on the buffer layer, forming a light emission layer on the hole transport layer, forming an electron transport layer on the light emission layer, and forming a cathode on the electron transport layer. The forming an inorganic buffer layer includes thermal evaporation and oxidation.

16 Claims, 7 Drawing Sheets

METHOD OF MANUFACTURING AN ORGANIC LIGHT EMITTING DIODE

This application claims priority to Korean Patent Application No.10-2005-0091762 filed in the Korean Intellectual Property Office on Sep. 30, 2005, and all the benefits accruing therefrom under 35 U.S.C. §119, the entire contents of which are incorporated herein by reference in its entirety.

BACKGROUND OF THE INVENTION (a) Field of the Invention

The present invention relates to a method of manufacturing an organic light emitting diode ("OLED").

(b) Description of the Related Art

As display devices have become larger, flat panel display devices that occupy small spaces become increasingly required. In particular, an organic light emitting diode ("OLED") display has been rapidly developed as one of the flat panel display devices.

An internal quantum efficiency of an OLED depends on the charge balance factor, the efficiency of production for singlet excitons, and the quantum efficiency of fluorescence. The efficiency of the OLED can be improved by adjusting one of the above-described terms For example, the charge balance factor such as injection and transport of electrons and holes related to the charge balance factor may bee adjusted.

In a π-conjugated compound, since hole mobility is tens to hundreds of times larger than electron mobility, the adjustment of the injection and the transport of holes may be sufficient to improve the efficiency of the OLED.

For adjusting the injection of holes, it is suggested that the surface of an anode made of indium tin oxide ("ITO") may be treated with an acid or a base, or a thin film of CuPc, ZnO, NiO, etc., may be inserted between an anode and a hole transport layer.

However, these methods need complicated processes and increase a driving voltage of the OLED.

In particular, the insertion of a sputtered NiO thin film causes manufacturing processes to become complicated, thereby increasing manufacturing time.

BRIEF SUMMARY OF THE INVENTION

In an exemplary embodiment, a manufacturing method of an OLED includes forming an anode on a substrate, forming an inorganic buffer layer on the anode, forming a hole transport layer on the buffer layer, forming a light emission layer on the hole transport layer, forming an electron transport layer on the light emission layer, and forming a cathode on the electron transport layer. The forming an inorganic buffer layer includes thermal evaporation and oxidation.

In an exemplary embodiment, the method may further include forming an electron injection layer between the light emission layer and the cathode. The inorganic buffer layer may include at least one of Ni, Zn, and Mg.

In an exemplary embodiment, the oxidation may be performed at about 550° C. to about 600° C.

In an exemplary embodiment, the inorganic buffer layer may have a thickness of about 5 nanometers (nm) to about 10 nanometers (nm).

DETAILED DESCRIPTION OF THE INVENTION

Figure 1:
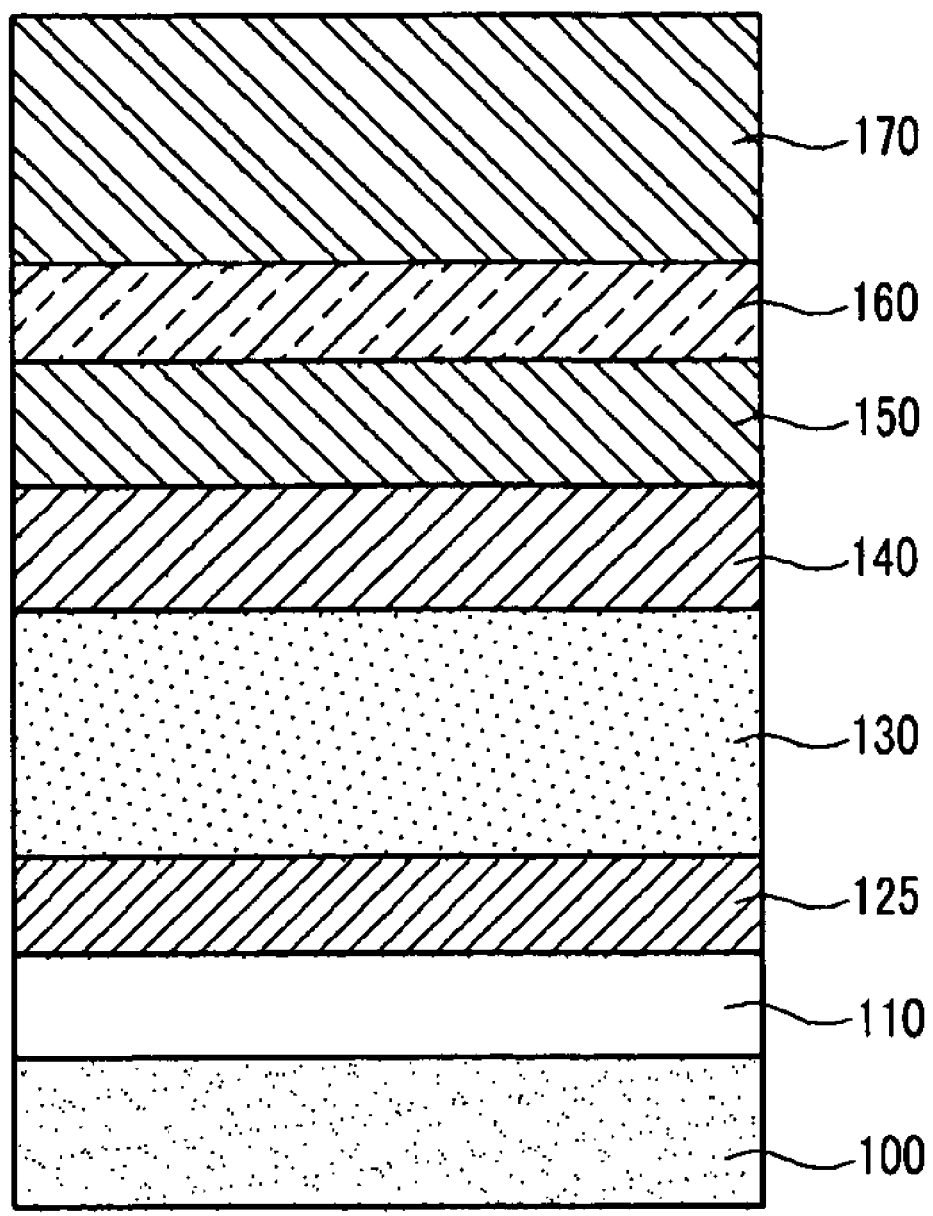
FIG. 1 is a cross-sectional diagram of an exemplary embodiment of an OLED according to the present invention.

The present invention now will be described more fully hereinafter with reference to the accompanying drawings, in which preferred embodiments of the invention are shown. The present invention may, however, be embodied in many different forms and should not be construed as limited to the embodiments set forth herein.

In the drawings, the thickness of layers, films, panels, regions, etc., are exaggerated for clarity. Like numerals refer to like elements throughout. It will be understood that when an element such as a layer, film, region, or substrate is referred to as being "on" another element, it can be directly on the other element or intervening elements may also be present. In contrast, when an element is referred to as being "directly on" another element, there are no intervening elements present.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the present invention will be described in detail with reference to the accompanying drawings.

Firstly, an exemplary embodiment of an OLED according to the present invention is described with reference to FIG. 1.

Referring to FIG. 1, an OLED includes a substrate 100, an anode 110, a buffer layer 125, a hole transport layer 130, a light emission layer 140, an electron transport layer 150, an electron injection layer 160, and a cathode 170. When a driving voltage is applied between the anode 110 and the cathode 170, holes and electrons are injected into a light emission layer 140 via the hole transport layer 130 from the anode 110 and via the electron transport 150/injection layer 160 from the cathode 170, respectively. The injected holes and electrons are bound and form excitons. The electrons and the holes in the excitons combine to emit visible light.

The visible light generated from the light emission layer 140 is transmitted through the transparent cathode 170 to display images.

In an exemplary embodiment, the anode 110 may include a transparent conductor having a high work function such as indium tin oxide ("ITO").

In an exemplary embodiment, the light emission layer 140 may include a low molecular organic material such as tris-(8-hydrozyquinoline)aluminum ($Alq_3$), anthracene, or a high molecular organic material such as poly(p-phenylenevinylene) ("PPV"), polythiophene ("PT"), and derivatives thereof.

The hole transport layer 130 is disposed between the light emission layer 140 and the anode 110. The electron transport layer 150 and the electron injection layer 160 are disposed between the light emission layer 140 and the cathode 170. In exemplary embodiments, the hole transport layer 130, the electron transport layer 150 and/or the electron injection layer 160 may include of a low molecular organic material or a high molecular organic material that can enhance the injection of charge carriers including holes or electrons. The hole transport layer 130, the electron transport layer 150 and the electron injection layer 160 enhance the quantum efficiency of the OLED and decrease the driving voltage of the OLED. In addition, the hole transport layer 130, the electron transport layer 150 and the electron injection layer 160 may block the charge carriers from moving into the electrodes 110 and 170 to adjust the recombination of the carriers, thereby enhancing the light emission efficiency.

In an exemplary embodiment, the hole transport layer 130 may include N,N'-diphenyl-N,N'-bis(1,1'-biphenyl)-4,4'-diamine ("NPB"), N,N'-diphenyl-N,N'-bis(3-methylphenyl)-(1,1'-biphenyl)-4,4'-diamine ("TPD"), or 11,11,12,12-tetracyano-9,10-anthraquinodimethane (Synth. Met. 85, 1267 1997). In an exemplary embodiment, the electron transport layer 150 may include a low molecular organic material such as tris-(8-hydrozyquinoline)aluminum ($Alq_3$), anthracene, etc., or poly(p-phenylenevinylene) ("PPV"), polythiophene ("PT"), 3-(4-biphenylyl)-4-phenyl-5-(4-tert-butylphenyl)-1, 2,4-triazole ("TAZ"), 2-(4-biphenylyl)-5-(4-tert-butylphenyl)-1,3,4-oxadiazole ("PBD"), bis(10-hydrozybenzo[h]qinolinatoberyllium) (Bebq2), 2,2,2'-(1,3,5-benzenetriyl)tris-[1-phenyl-1H-benzimidazole] ("TPBI"), etc.

In an exemplary embodiment, the electron injection layer 160 may include a thin film of LiF or lithium quinolate ("Liq"), alkali metals such as Li, Ca, Mg, and Sr, or alkali earth metals. In an alternative exemplary embodiment, the electron injection layer 160 may be omitted.

In an exemplary embodiment, the cathode 170 may include a material having a low work function. The material of the cathode 170 may include, but is not limited to, a metal such as Ca, Mg, and Al.

The buffer layer 125 may include inorganic material such as an oxide of a metal including, but not limited to, Ni, Mg, or Zn. In one exemplary embodiment, the buffer layer 125 may include NiO that has an energy gap of about 3.6 electron volt (eV).

In exemplary embodiments, the buffer layer 125 may have a thickness of about 5 nanometers (nm) to about 10 nanometers (nm). It may be difficult to form the buffer layer 125 to be uniform when the target thickness of the buffer layer is less than about 5 nm. When the thickness of the buffer layer 120 is greater than about 10 nm, the voltage required for the tunneling of the holes into the buffer layer 125 may increase to increase the overall threshold voltage of the OLED. The inorganic buffer layer 125 reduces or effectively prevents ingredients of the anode 110, for example, indium of ITO, from diffusing into the organic hole transport layer 130. The inorganic buffer layer 125 reduces the degradation of the hole transport layer 130 and adjusts the balance between holes and electrons in the light emission layer 140, thereby improving the overall efficiency of the OLED.

In an exemplary embodiment, the OLED may further include a hole injection layer (not shown) disposed between the buffer layer 125 and the hole transport layer 130. In an alternative exemplary embodiment, the OLED may include the electron transport layer 150 and/or the electron injection layer 160.

Figure 2A:
FIG. 2A to 2C are cross-sectional diagrams showing exemplary embodiments of manufacturing processes and layer structures of an OLED according to the present invention.

Now, an exemplary embodiment of a method of manufacturing the OLED shown in FIG. 1 according to the present invention is described in detail with reference to FIG. 2A, FIG. 2B, and FIG. 2C. Referring to FIG. 2A, an ITO layer is deposited on an insulating substrate 100, such as a glass substrate, to form an anode 110.

Figure 2B:
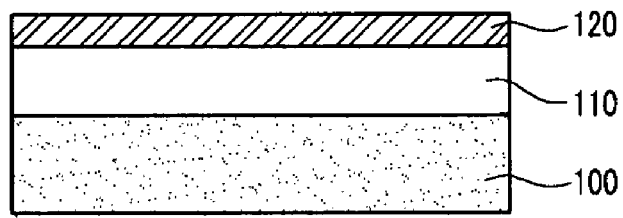

A metal thin film 120 is thermally evaporated on the anode 110 as shown in FIG. 2B. The metal thin film 120 may include at least one of Ni, Mg, and Zn.

Figure 2C:
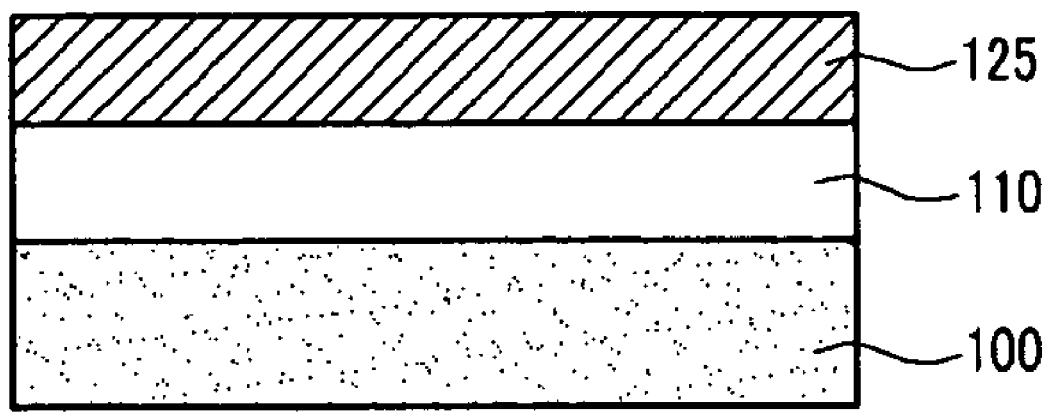

Next, the metal thin film 120 is processes, such as being subjected to heat treatment, such that the metal thin film 120 is oxidized to form a buffer layer 125 as shown in FIG. 2C. In one exemplary embodiment, the heat treatment for the oxidation may be performed at a temperature of about 500° C. to about 600° C. The heat treatment at a temperature below about 500° C. may slow down the oxidation speed and the heat treatment at a temperature above about 600° C. may diffuse the metal elements of the metal thin film 120 into the anode 110 or the substrate 100. In an exemplary embodiment, light transmittance of a NiO thin film formed on an ITO anode was measured. The measured light transmittance was greater than about 80%. A light transmittance greater than about 90% was also obtained by adjusting the conditions of the deposition and the heat treatment.

Referring to FIG. 1, a hole transport layer 130, a light emission layer 140, an electron transport layer 150, an electron injection layer 160 and a cathode 170 are sequentially formed on the buffer layer 125.

As in the illustrated exemplary embodiments, the thermal evaporation for forming the buffer layer 125 according to the present invention is advantageous in comparison to a sputtering method because the thermal evaporation may include less equipment costs, simpler process control and relatively fast film growing. An added advantage includes that the thermal evaporation does not cause damage on the anode 110 or the substrate 100, which may be normally caused by the sputtering method. Additionally, as in the illustrated exemplary embodiment, the oxidation, particularly when it is simultaneous performed on several devices, is advantageous for mass production.

The inorganic buffer layer 125 formed as in the illustrated exemplary embodiments reduces or effectively prevents ingredients of the anode 110, for example, indium of ITO, from diffusing into the organic hole transport layer 130. The inorganic buffer layer 125 reduces the degradation of the hole transport layer 130 and adjusts the balance between holes and electrons in the light emission layer 140, thereby improving the efficiency of the OLED. Now, exemplary embodiments of the relationship between various characteristics of an OLED according to the present invention and the heat treatment time for forming the buffer layer of the OLED will be described in detail with reference to FIG. 3 to FIG. 6.

Figure 3:
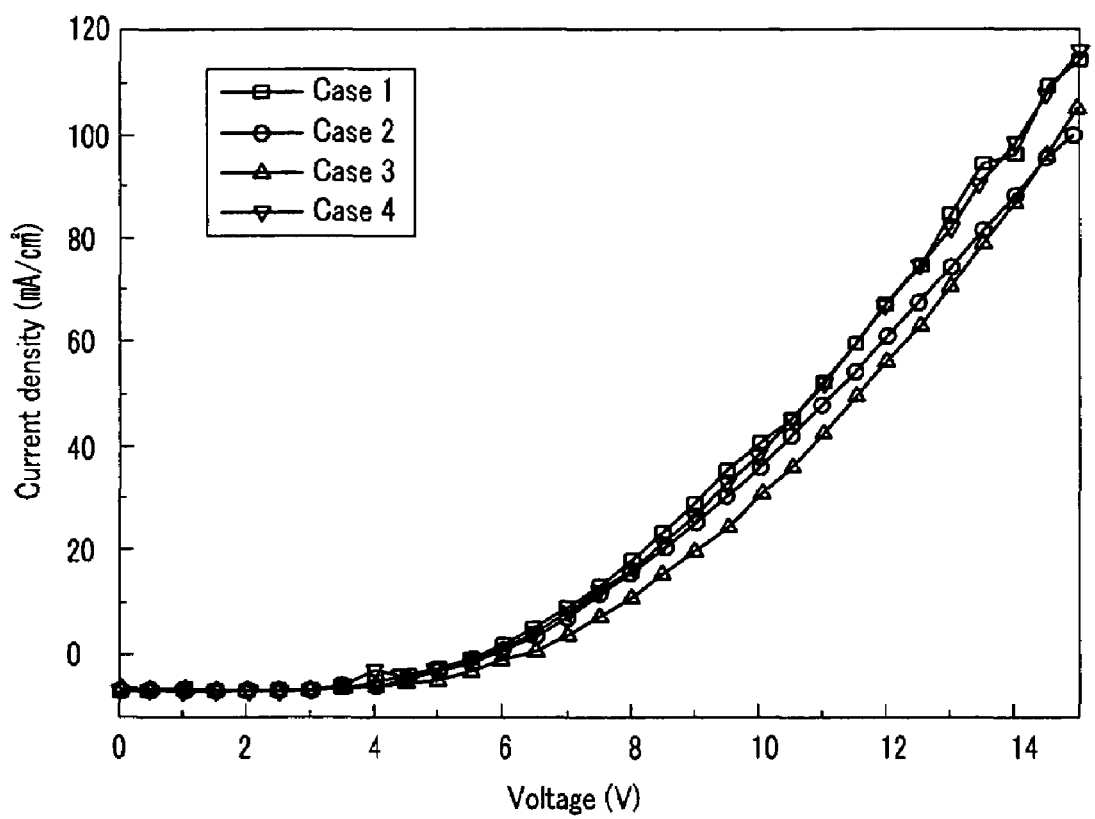
FIG. 3 is a graph showing an exemplary embodiment of the current density of an OLED according to the present invention as function of applied voltage.
Figure 4:
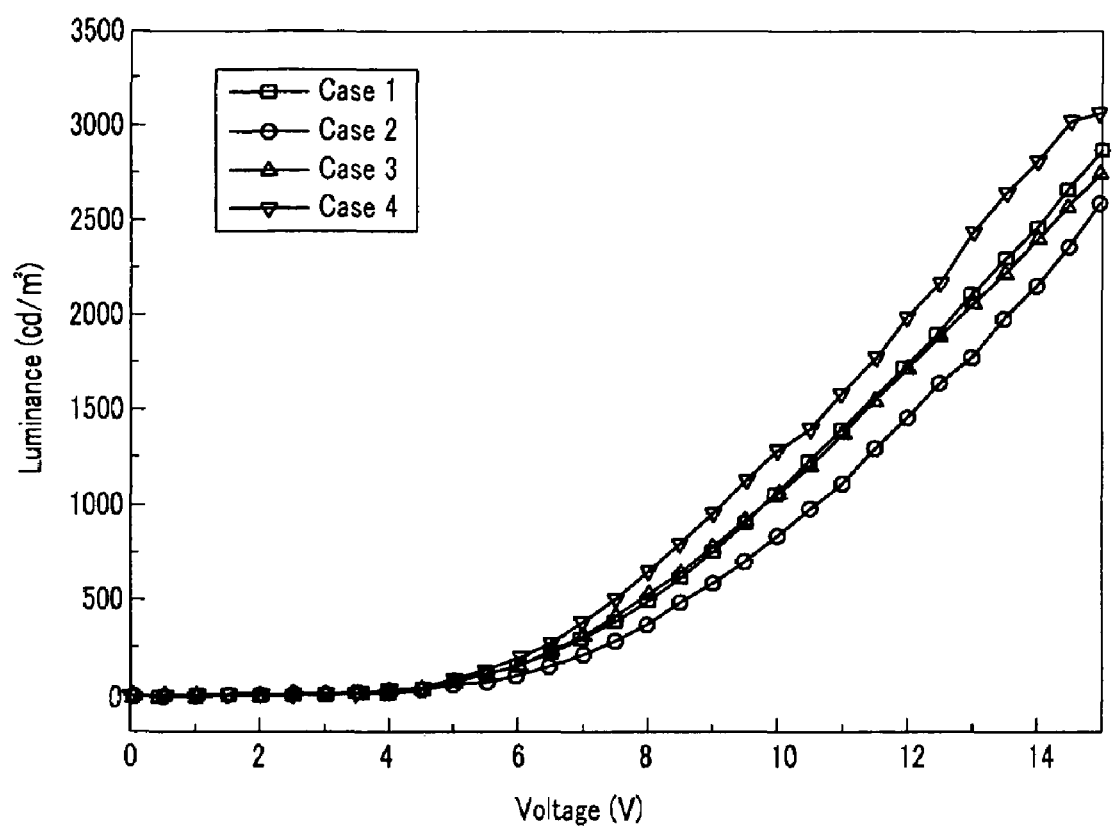
FIG. 4 is a graph showing an exemplary embodiment of the luminance of the OLED according to the present invention as function of applied voltage.
Figure 5:
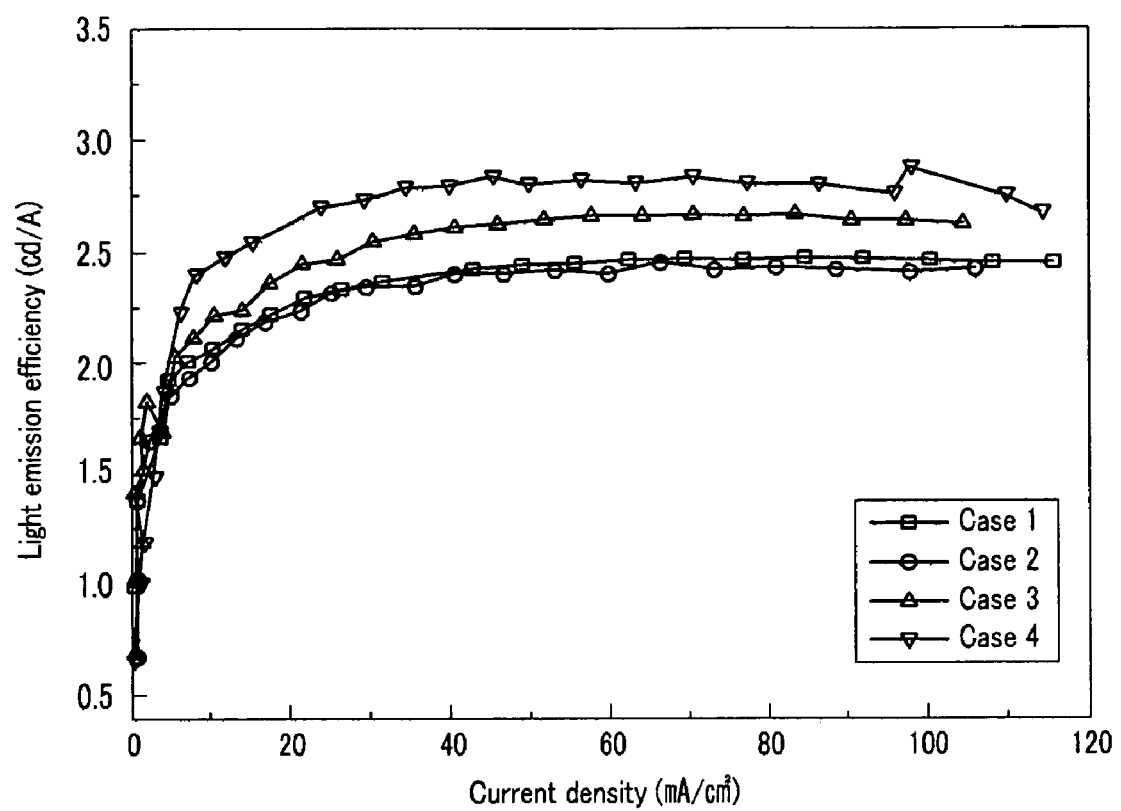
FIG. 5 is a graph showing an exemplary embodiment of luminous efficiency of the OLED according to the present invention as function of current density.
Figure 6:
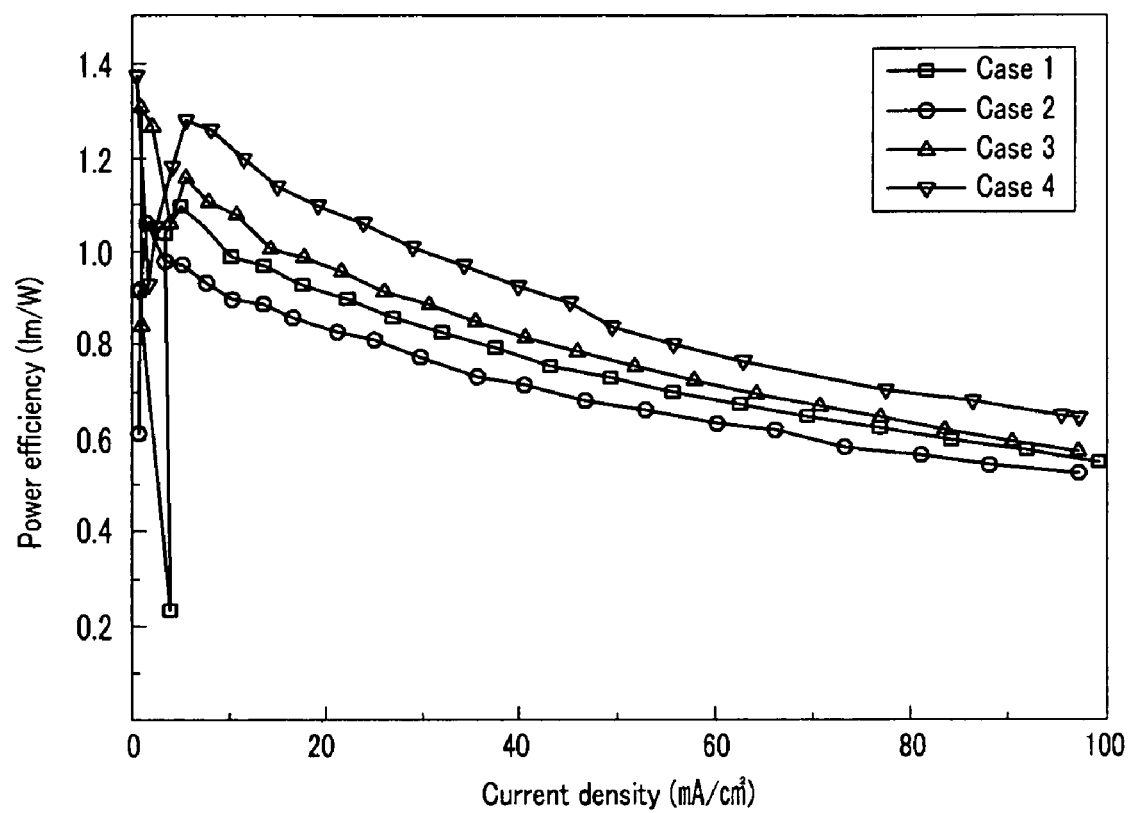
FIG. 6 is a graph showing an exemplary embodiment of power efficiency of an OLED according to the present invention as function of current density.

FIG. 3 is a graph showing an exemplary embodiment of the current density of an OLED according to the present invention as function of applied voltage, FIG. 4 is a graph showing an exemplary embodiment of the luminance of the OLED as function of applied voltage, FIG. 5 is a graph showing an exemplary embodiment of luminous efficiency of the OLED as function of current density, and FIG. 6 is a graph showing an exemplary embodiment of power efficiency of an OLED as function of current density.

Firstly, an OLED was manufactured by an exemplary embodiment of a method according to the present invention as follows.

A thin film made of ITO having low sheet resistance of about 30 ohms per centimeter (Ω/cm) and high transmittance of about 90% was deposited on a glass substrate 100 using an organic molecular beam epitaxy system, etc., to form an anode 110.

Next, the anode 110 was subjected to $O_2$ plasma treatment, and then a Ni thin film 120 having a thickness of about 5 nm to about 10 nm was thermally evaporated on the anode 110. The thermal evaporation was performed under a vacuum of about $5 \times 10^{-6}$ Torr and at a room temperature. A source of Ni (not shown) having a purity of about 99.99%, a diameter of about 3 mm, and a thickness of about 2 mm and a holder of Mo (not shown) were used for thermal evaporation, and the distance between the substrate 100 and the holder was equal to about 60 cm to ensure uniformity of the thin film 120 and to prevent spitting during evaporation. The deposition rate of Ni was smaller than about 0.1 Å/second, and a rotary motor coupled with a substrate holder was used to improve uniformity of the Ni thin film 120 over the substrate 100.

Then, the Ni thin film 120 was oxidized to form a buffer layer 125.

Here, the Ni thin film 120 was cleaned with methanol and distilled water for about 5 minutes, and was heated to about 550° C. under an air atmosphere to be oxidized such that the Ni thin film 120 was transformed into a NiO buffer layer 125. The heat treatment was performed for about 1 hour, about 2 hours, about 3 hours, and about 4 hours, for respective cases.

Next, NPB was deposited on the NiO buffer layer 125 under a vacuum of about $10^{-7}$-$10^{-9}$ Torr to form a hole transport layer 130 having a thickness of about 60 nm. $Alq_3$ was deposited on the hole transport layer 130 under a vacuum of about $10^{-7}$-$10^{-9}$ Torr and at a deposition rate of about 0.1 nm/second to form a light emission layer 140 and an electron transport layer 150 having a thickness of about 50 nm.

Next, Liq was deposited to about 2 nm under a vacuum of about $10^{-7}$-$10^{-9}$Torr and a deposition rate of about 0.1 nm/second to form an electron injection layer 160, and then Al was deposited to about 100 nm as a cathode 170.

The various characteristics of the OLED manufactured as described above were measured as follows.

Firstly, the current density of the OLED manufactured as described above was measured using KEITHELY (model: 236 SOURCE MESURE UNIT) for applied voltages from about 0V to about 15V at an interval of 0.5V as shown in FIG. 3.

FIG. 3 shows four curves for the time of heat treatment of about one (1) hour (case 1), about two (2) hours (case 2), about three (3) hours (case 3), and about four (4) hours (case 4), respectively. Referring to FIG. 3, the current density at a voltage of about 10V was about 43.3 mA/cm$^2$ in case 1, about 35.8 mA/cm$^2$ in case 2, about 40.6 mA/cm$^2$ in case 3, and 45.1 mA/cm$^2$ in case 4.

Although the current density for the two hour heat treatment decreased as compared with that for the one hour heat treatment, the current density increased as the time for the heat treatment increased from two hours. The decrease in the current density until 2 hours may be caused by the dominant decrease of the leakage current of holes passing through the Ni/NiO thin film. However, since the two hour treatment may complete the oxidation, the increase of the current density caused by the tunneling of the holes across the thin film may outrun the decrease of the leakage current after two hour heat treatment, and thus the current density may increase. Accordingly, the current decreased up to two hours because the leakage current decreased, while the current increased due to tunneling after two hours when the Ni thin film was completely oxidized. For cases 1 to 4, the luminance of the OLED was measured with a luminance measuring instrument of CHROMA METER CS-100A by applying voltages from about 0V to about 15V using KEITHELY (model: 236 SOURCE MESURE UNIT) as shown in FIG. 4.

Referring to FIG. 4, the luminance at a voltage of about 10V was about 1050 cd/m$^2$ in case 1, about 840 cd/m$^2$ in case 2, about 1060 cd/m$^2$ in case 3, and about 1280 cd/m$^2$ in case 4.

Like the current density shown in FIG. 3, the luminance decreased from the one hour heat treatment to the two hour heat treatment and then gradually increased for the three hour heat treatment and the four hour heat treatment.

The light emission efficiency of the OLED for cases 1 to 4 was measured as function of current density. Here, prismatic luminance efficiency and luminance emission intensity were integrated from the current density-voltage characteristic and the luminance-current density characteristic in the visible ray region, and the integrated result was divided by the current density to be shown in FIG. 5 depending on the current density.

Referring to FIG. 5, the light emission efficiency at the current density of 70 milliampere per squared centimeter (mA/cm$^2$) was about 2.47 candela per ampere (cd/A) in case 1, about 2.42 cd/A in case 2, about 2.67 cd/A in case 3, and about 2.84 cd/A in case 4.

Like the current density shown in FIG. 3, the light emission efficiency decreased from the one hour heat treatment to the two hour heat treatment and then gradually increased for the three hour heat treatment and the four hour heat treatment.

The power efficiency of the OLED for cases 1 to 4 was measured as function of current density. Here, prismatic luminance efficiency and luminance emission intensity were integrated from the current density-voltage characteristic and the luminance-current density characteristic in the visible ray region, and the integrated result was divided by the power intensity to be shown in FIG. 5 depending on the current density.

Referring to FIG. 6, the power efficiency at the current density of 70 mA/cm$^2$ was about 0.646 lumen per watt (lm/W) in case 1, about 0.584 lm/W in case 2, about 0.67 lm/W in case 3, and about 0.743 lm/W in case 4. The power efficiency decreased from the one hour heat treatment to the two hour heat treatment and then gradually increased for the three hour heat treatment and the four hour heat treatment.

As is illustrated in the exemplary embodiments, the luminance characteristic, the light emission efficiency, and the power efficiency of the OLED were improved depending on the degree of the oxidation of the Ni thin film.

As in the illustrated exemplary embodiments, a buffer layer obtained by thermal evaporation and oxidation can improve the efficiency of the OLED. Additionally, a buffer layer obtained by thermal evaporation and oxidation may also include a relatively lower manufacturing and/or processing cost and simply process.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A manufacturing method of an organic light emitting diode, comprising:
    forming an anode on a substrate;
    forming an inorganic buffer layer, the forming the inorganic buffer layer comprising forming a metal layer on the anode by thermal evaporation and subjecting the formed metal layer to heat treatment;
    forming a hole transport layer on the buffer layer;
    forming a light emission layer on the hole transport layer;
    forming an electron transport layer on the light emission layer; and
    forming a cathode on the electron transport layer.

2. The method of claim 1, further comprising:
    forming an electron injection layer between the light emission layer and the cathode.

3. The method of claim 1, further comprising:
    forming a hole injection layer between the inorganic buffer layer and the hole transport layer.

4. The method of claim 1, wherein the inorganic buffer layer comprises at least one of Ni, Zn, and Mg.

5. The method of claim 1, wherein the heat treatment is performed at about 550° C. to about 600° C.

6. The method of claim 1, wherein the buffer layer has a thickness of about 5 nm to 10 nm.

7. The method of claim 1, wherein the anode comprises indium tin oxide.

8. An organic light emitting diode comprising:
    a first electrode formed on a substrate;
    an inorganic buffer layer formed through forming a metal layer on the first electrode by thermal evaporation and subjecting the formed metal layer to heat treatment;
    a first transport layer formed on the first electrodes;
    a light emission layer formed on the first transport layers;
    a second transport layer formed on the light emission layer;
    a first injection layer formed on the second transport layer; and
    a second electrode formed on the electron injection layer.

9. The organic light emitting diode of claim 8, wherein
    the first and second electrode are an anode and a cathode, respectively; and
    the first and second transport layer are a hole transport layer and an electron transport layer, respectively.

10. The organic light emitting diode of claim 9, wherein the first injection layer is an electron injection layer.

11. The organic light emitting diode of claim 10, further comprising a second injection layer disposed between the buffer layer and the hole transport layer, the second injection layer being a hole injection layer.

12. The organic light emitting diode of claim 8, wherein the inorganic buffer layer comprises at least one of Ni, Zn, Mg and a combination including at least one of the foregoing.

13. The organic light emitting diode of claim 8, wherein the heat treatment is performed at about 550° C. to about 600° C.

14. The organic light emitting diode of claim 8, wherein the buffer layer has a thickness of about 5 nm to 10 nm.

15. The organic light emitting diode of claim 8, wherein the first electrode comprises indium tin oxide.

16. An organic light emitting diode comprising:
    a first electrode formed directly on a substrate;
    an inorganic buffer layer formed directly on the first electrode;
    a hole injection layer formed on the inorganic buffer layer such that the inorganic buffer layer is disposed between the hole injection layer and the first electrode;
    a hole transport layer formed on the hole injection layer such that the hole injection layer is disposed between the hole transport layer and the inorganic buffer layer;
    a light emission layer formed directly on the hole transport layer;
    an electron transport layer formed directly on the light emission layer;
    an electron injection layer formed directly on the electron transport layer; and
    a second electrode formed directly on the electron injection layer.

* * * * *